United States Patent [19]
Sears

[11] Patent Number: 6,122,492
[45] Date of Patent: Sep. 19, 2000

[54] ADJUSTABLE RADIO FREQUENCY POWER AMPLIFIER AND TRANSMITTER

[75] Inventor: Frederick E. Sears, Sunnyvale, Calif.

[73] Assignee: Motorola, Inc., Schaumburg, Ill.

[21] Appl. No.: 09/246,232

[22] Filed: Feb. 8, 1999

[51] Int. Cl.[7] .................................................. H01Q 11/12
[52] U.S. Cl. ......................................... 455/127; 330/124 R
[58] Field of Search ..................................... 455/571, 572, 455/127, 128, 129, 103, 118, 114; 330/10, 124 R, 146, 149

[56] References Cited

U.S. PATENT DOCUMENTS

| | | | |
|---|---|---|---|
| 4,346,384 | 8/1982 | Raab | 342/451 |
| 4,965,530 | 10/1990 | Katz | 330/295 |
| 5,363,072 | 11/1994 | Sakamoto et al. | 333/125 |
| 5,974,041 | 10/1999 | Kornfeld et al. | 370/342 |
| 6,009,324 | 12/1999 | Pravitz et al. | 455/423 |
| 6,037,837 | 3/2000 | Miyaji et al. | 330/149 |
| 6,055,418 | 4/2000 | Harris et al. | 455/91 |

*Primary Examiner*—Dwayne D. Bost
*Assistant Examiner*—Jean Alland Gelin
*Attorney, Agent, or Firm*—Terri S. Hughes

[57] ABSTRACT

A modulator (104) varies the duty cycle of a waveform to amplitude modulate information for transmission. A push-pull amplifier (106) in accordance with the invention, preferably constructed of CMOS devices, receives the waveform with a varying duty cycle in order to drive an antenna (108) such that a wireless transceiver can become excited by the oscillating waveform and receive the amplitude modulated signal and demodulate it to obtain the transmitted information. The power generated by the push-pull power amplifier (106) is simply increased or decreased by varying the voltage of the power supplied to the power amplifier or by varying the number of devices driving the antenna (108) in parallel.

16 Claims, 6 Drawing Sheets

ADJUSTABLE RADIO FREQUENCY POWER AMPLIFIER AND TRANSMITTER

FIELD OF THE INVENTION

The invention relates generally to radio frequency power amplifiers, and in particular to radio frequency power amplifier output stages for driving antenna.

BACKGROUND OF THE INVENTION

In order to have an antenna radiate RF signals it is necessary to drive an antenna with some sort of power amplifier. Traditional power amplifiers generally have a large power source available in order to drive the antenna. In this case, power consumption by the amplifier is of little concern. Additionally, the space available for the amplifier, such as on a printed circuit board, is ample for nearly any kind of design including those that consist of large inductors or transformers. Also, since many large power amplifiers are not mass manufactured, the ease of manufacture is of little concern.

Traditionally, the output stage of a power amplifier that drives an antenna consists of bipolar transistors because their output impedance is low and they are capable of sourcing or sinking large currents. The large current necessitates transistors that tend to be large in size, typically requiring heat sinks to dissipate heat in order to maintain proper operation. Additionally, the other components of this circuitry, including large transformers and inductors, consume a great deal of space or circuit area. In order to maximize the power output to the antenna, the bipolar transistors are often driven in a push-pull fashion such that the bipolar transistor driving one side of the antenna is close to being 180 degrees out of phase with the other bipolar transistor driving the opposite side of the antenna. And, the impedance of the bipolar output stage is matched with the impedance of the antenna to maximize the power output. Because of the nature of bipolar transistors, circuit trimming devices such as variable resistors and capacitors are often used within the power amplifier circuit in order to properly tune the output stage to drive at the proper frequency and power output levels. Also, in operation, the bipolar transistors provide a substantially fixed, rather than adjustable power output.

Diode Metal Oxide Semiconductor (DMOS) devices are alternatively used in the place of bipolar transistors in the output stage of power amplifiers. These devices have limitations that are similar to bipolar devices, including requiring a heat sink or other heat-dissipating device when at high output power requirements. These heat-dissipating devices tend to be large and expensive, taking up valuable space on a printed circuit board and increasing manufacturing cost of the power amplifier.

Today there are radio frequency (RF) systems that require high volume manufacture at low costs using a minimal amount of circuit components and printed circuit board (PCB) area. One such RF system is a radio frequency identification (RFID) system. In order to make the RFID systems in high volume at low cost, it is desirable to improve the ease of manufacture of a power amplifier. Additionally, it is desirable to eliminate the circuit trimming devices, the large circuit components and the heat sinks ordinarily used in power amplifier design. Furthermore, it is desirable to lower manufacturing costs by developing a power amplifier that requires minimal PCB area by using smaller off the shelf components. And, because of the prevalence of portable systems, it is desirable to reduce the power consumption so that battery-operated systems have a longer battery replacement cycle. Traditional bipolar and DMOS power amplifiers have obvious shortcomings in providing the desired level of manufacturablity, portability, power efficiency and flexibility.

Therefore a need exists for an adjustable radio frequency power amplifier that is readily mass manufactured, power efficient, flexible and compact in size.

DETAILED DESCRIPTION OF THE PREFERRED EMBODIMENTS

In the following detailed description of the present invention, numerous specific details are set forth in order to provide a thorough understanding of the present invention. However, it will be obvious to one skilled in the art that the present invention may be practiced without these specific details. In other instances, well-known methods, procedures, components, and circuits have not been described in detail as not to unnecessarily obscure aspects of the present invention.

In summary, the present invention includes a radio frequency power amplifier and transmitter for driving an electromagnetic or electrostatic antenna or both such that a receiver can be excited and can receive transmitted information from the power amplifier. The radio frequency power amplifier receives a variable duty cycle waveform and is configured such that this input waveform is amplified by a first set of parallel buffers, which drive a first antenna connection. The input waveform is inverted and then amplified by a second set of parallel buffers that drive a second connection to the antenna. The number of buffers that are connected in parallel in the first set and second set may vary from one to many, providing flexibility and adjustability in the output power of the amplifier. And, control is alternatively provided for adjusting the output power of the amplifier by selectively adjusting the number of active buffers or adjusting a power supply voltage.

Figure 1:
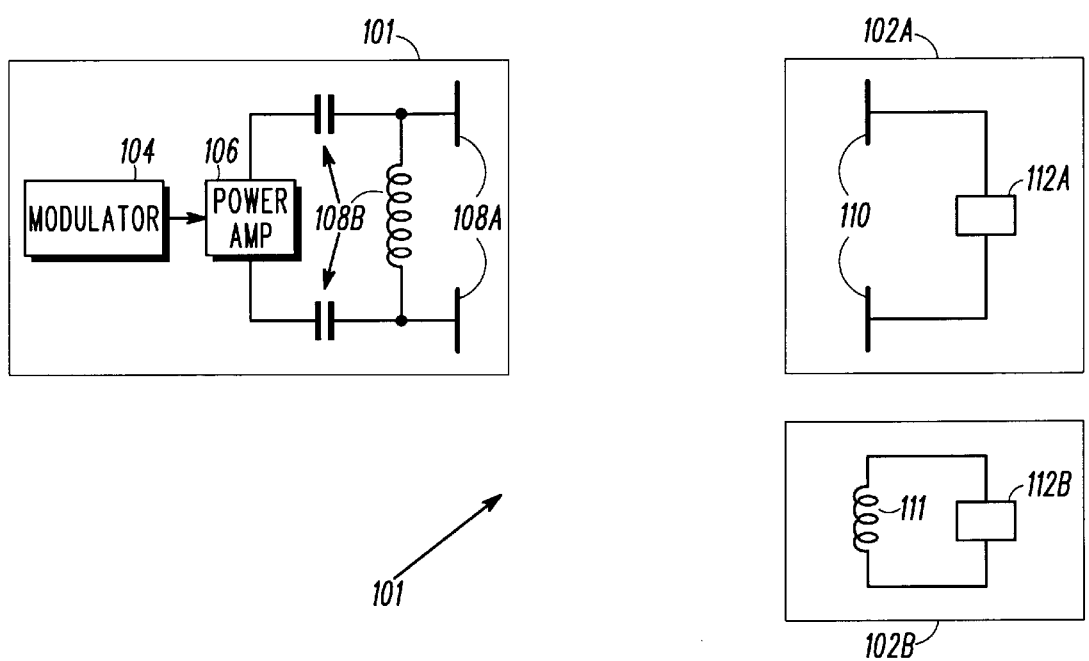
FIG. 1 is a system level diagram illustrating a radio frequency system in accordance with a preferred embodiment of the present invention.

FIG. 1 illustrates an exemplary radio frequency (RF) system 100 employing a power amplifier 106 in accordance with the present invention. The RF system 100 includes a radio frequency exciter 101, a wireless electrostatic receiver or transceiver 102A and a wireless electromagnetic receiver or transceiver 102B. Radio frequency exciter 101 electrostatically or electromagnetically transmits a carrier signal in order to excite a wireless transceiver or receiver. Although the wireless transceivers often include some energy storage mechanism such as a battery, they are preferably batteryless, which is commonly referred to as being a "passive" transceiver, although the circuitry itself is activated, making the device active. The wireless transceiver is alternatively either electrostatic or electromagnetic, as illustrated by electrostatic transceiver 102A and electromagnetic transceiver 102B, respectively. For simplicity, the transceivers 102A and 102B are referred to hereinafter as transceiver 102. Transceiver 102 is commonly known as a radio frequency identification (RFID) transponder.

The radio frequency exciter 101 transmits modulated signals at an excitation frequency in order to communicate and write information to transceiver 102. The radio frequency exciter 101 includes a modulator 104, a power amplifier 106, and either an electrostatic antenna 108A, an electromagnetic antenna 108B or both. Electrostatic antenna 108A and electromagnetic antenna 108B are referred to herein collectively as antenna 108. Antenna 108 has a first connection to power amplifier 106 at one end and a second connection to power amplifier 106 at an opposite end.

Typically, radio frequency exciter 101 also includes a reader for receiving a wireless signal from transceiver 102, the wireless signal from the transceiver being sent in response to the modulated signal from the exciter. The reader circuitry is not shown.

Electrostatic transceiver 102A includes an electrostatic antenna 110 and a transceiver integrated circuit 112A. Similarly, electromagnetic transceiver 102B includes an electromagnetic antenna 111 and a transceiver integrated circuit 112B. Typically, the integrated circuits 112A and 112B include circuitry to convert the electrostatic or electromagnetic energy received by antennas 112A and 112B, respectively, into a power source. Also the integrated circuits 112A and 112B include the control logic to receive, decode and respond to the wireless signal sent by exciter 101.

Figure 2:
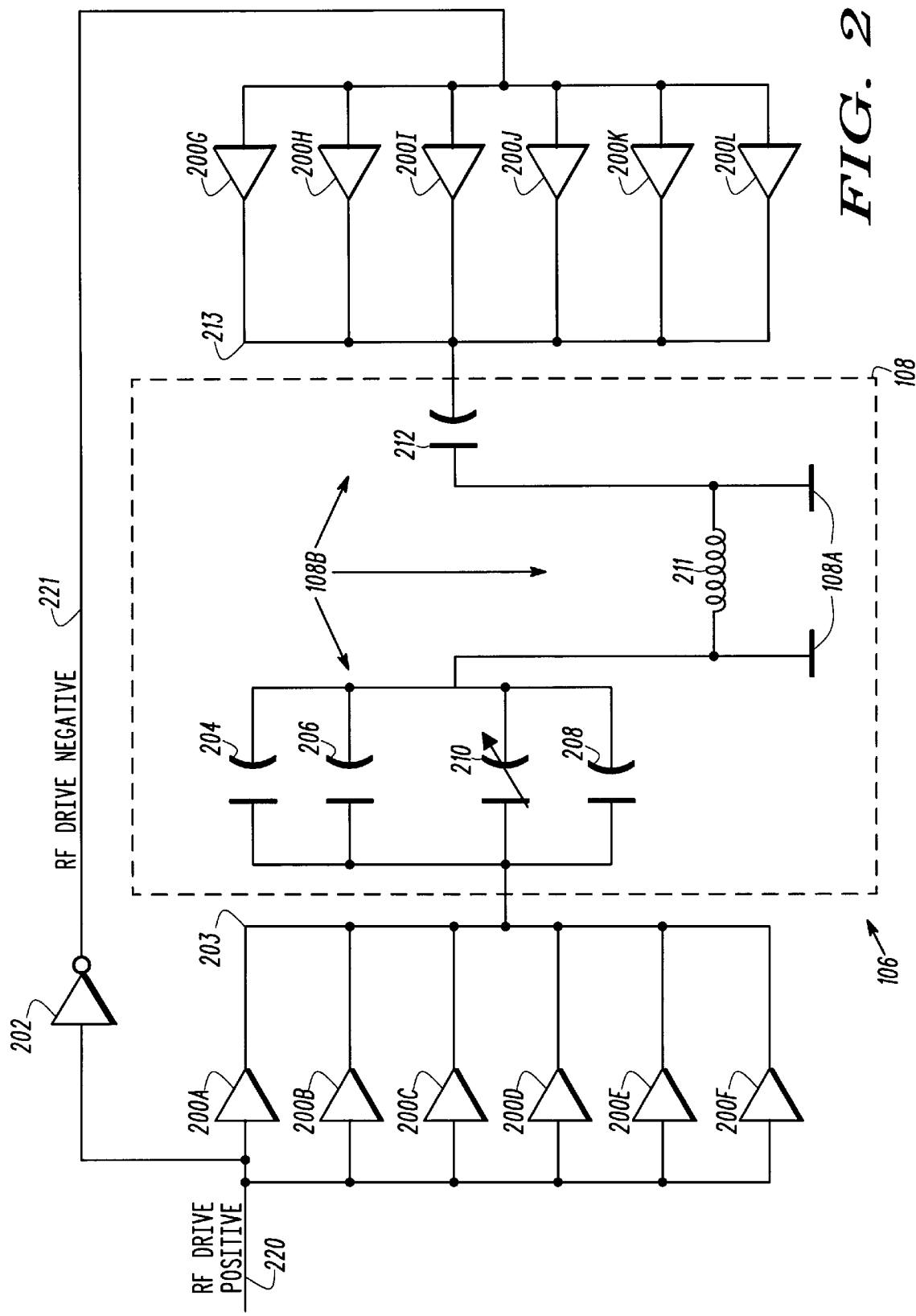
FIG. 2 is a schematic diagram of a power amplifier with associated circuitry in accordance with a preferred embodiment of the present invention.

FIG. 2 illustrates a schematic of power amplifier 106 and its connection to antenna 108. Power amplifier 106 includes a first set of buffers 200A–200F, a second set of buffers 200G–200L and an inverter 202. The first set of buffers 200A–200F has their inputs and outputs, respectively, connected in parallel in order to generate the proper drive power for the preferred RF system 100. Similarly, the second set of buffers 200G–200L has their inputs and outputs, respectively, connected in parallel. The drive power is a function of the number of buffers. The number of buffers alternatively varies from one to a plurality. The desire is to generate large amounts of current at the fundamental frequency of oscillation.

Antenna 108 includes capacitors 204, 206, 208, 210, variable capacitor 210, radiating coil 211 and electrostatic antenna 108A. Variable capacitor 210 is connected in parallel with capacitors 204, 206 and 208, which are connected in series with the radiating coil 211 and capacitor 212 to generate a series tank circuit to properly radiate RF energy through the electrostatic antenna 108A and electromagnetic antenna 108B. Capacitors 204, 206, 208 and 210 balance electromagnetic antenna 108B and in conjunction with capacitor 212 keep the first and second set of buffers 200A–200L from directly driving the radiating coil 211.

Variable capacitor 210 is available to trim the antenna so that the series resonance of the combination of capacitors 204, 206, 208, coil 211 and capacitor 212 is at the fundamental frequency being generated. Antenna tuning by variable capacitor 210 is the only tuning that need be performed with the present invention. Prior power amplifiers typically require in addition to the tuning capacitor at least an additional variable capacitor for power matching.

The RF drive positive signal 220, which is a waveform signal, is generated by modulator 104 at the appropriate frequency and duty cycle for the preferred RF system 100. Inverter 202 is simply an inverter or a NAND gate with its inputs tied together in parallel. Of course, other logic gates and circuits perform this function as well. Inverter 202 generates the RF drive negative signal 221 by inverting the RF drive positive signal 220. The RF drive negative signal 221 is an out-of-phase waveform signal approximately one hundred eighty degrees out of phase with the RF drive positive signal 220. The RF drive positive signal 220 input into buffers 200A–200F and the RF drive negative signal 221 input into buffers 200G–200L each causes a signal which is approximately a square wave to drive the antenna 108.

Figure 3:
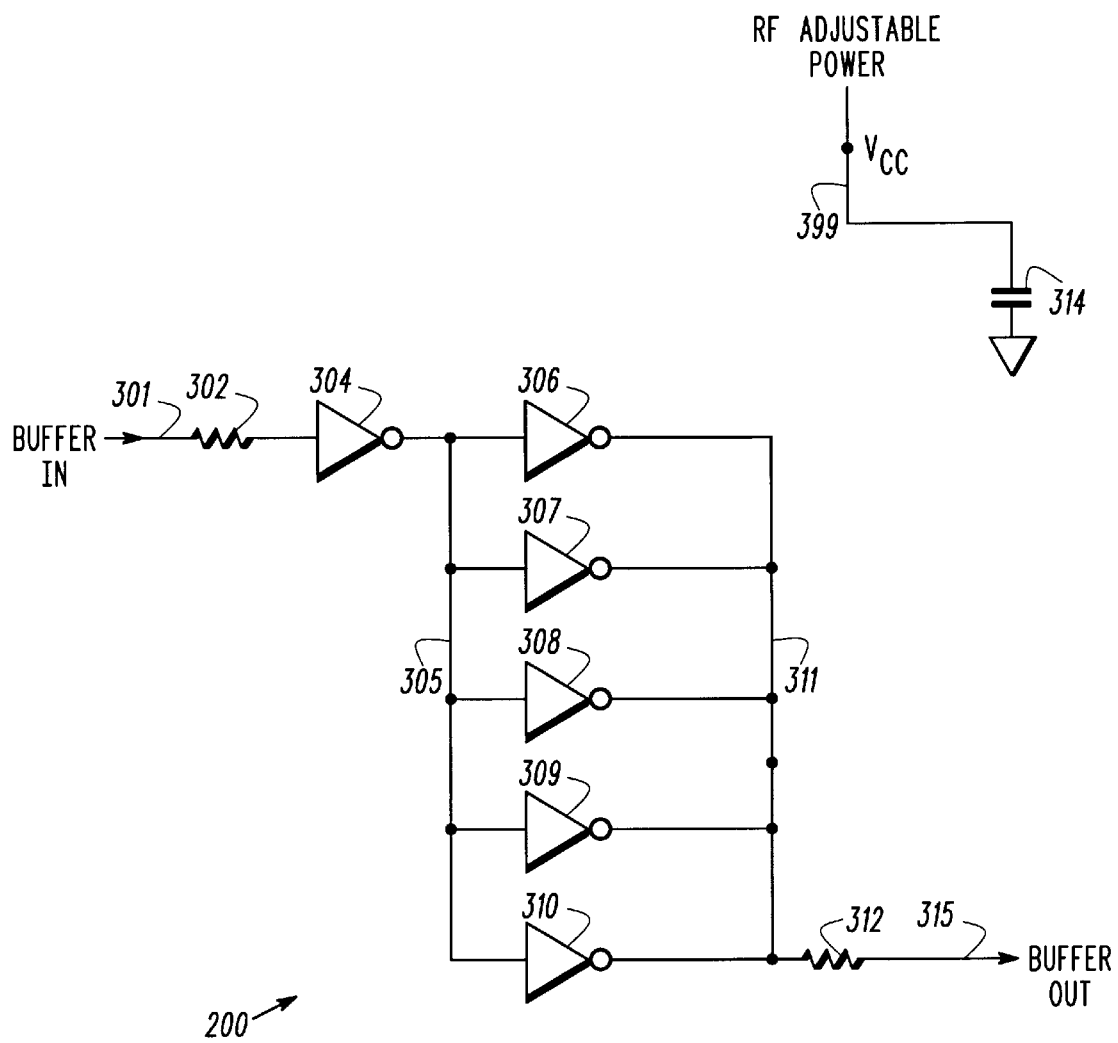
FIG. 3 is a schematic diagram of a preferred embodiment of the buffer component shown in FIG. 2.

FIG. 3 illustrates a detailed circuit schematic of a buffer that is representative of each of the buffers 200A–200L in FIG. 2. The buffer illustrated in FIG. 3 is referred to by the general reference designator 200. Preferably the power amplifier 106 is a CMOS power amplifier where each buffer 200 is constructed from a CMOS hex inverter integrated circuit configured as shown in FIG. 3. The Motorola MC74AC04 is exemplary of such an integrated circuit. Using CMOS hex inverter integrated circuits advantageously spreads the current drive capability over a number of devices and allows for spreading out the devices on a printed circuit board. This eliminates the need for heat sinks or other heat dissipating devices or techniques. The CMOS inverter provides large currents at the fundamental frequency and the CMOS outputs advantageously drive varying load impedance, including a low impedance load, such as the electromagnetic antenna 108B, or a high or infinite impedance load without damage. Additionally, even if the antenna tuning varies widely, the CMOS device is not damaged. The standing wave ratio (SWR) of the power amplifier is a nonfactor when using CMOS devices.

The buffer 200 has an input protection resistor 302 coupled to an input of the inverter 304 for receiving an input signal. Inverter 304 receives the input signal, inverts the input signal generating an inverted signal on inverter output 305. The inverter output 305 of inverter 304 is coupled to the inputs of inverters 306–310, which are coupled together in parallel. The outputs of inverters 306–310 are coupled together in parallel at node 311 in order to strongly generate a drive signal by inverting the inverted signal generated by inverter 304. The output protection resistor 312 protects the outputs of inverters 306–310. Additionally, output protection resistor 312 is sized to set the desired Q of the antenna. While input protection resistor 302 is around one hundred ohms, the output protection resistor 312 is on the order of five ohms.

The power supply connections of the inverters 304, 306–310 are coupled to an RF adjustable power source 399. The RF adjustable power source 399 is an adjustable power supply with an output that varies from a low of approximately two and one-half volts to a level of five volts in order to vary the power output to the antenna 108. It is desirable to vary the power output if the power demands of the transceiver 102 increase because of the circuitry contained therein. Additionally, in accordance with the present invention, the number of buffers is preferably increased or reduced in order to vary the power output to the antenna 108 for a given power supply voltage. Most preferably, varying the number of buffers 200A–200L is performed in a programmable way by using tristatable buffers. This advantageously allows superior flexibility in adjusting the power output of the power amplifier.

Each buffer 200 preferably includes a power supply bypass capacitor 314 having a first end connected to VCC, the high level power supply, and a second end connected to ground or VSS, the low level power supply. Resistor 302, resistor 312 and capacitor 314 are preferably chip packages, reducing the required PCB area. Alternatively, these components are eliminated in an aggressive design of the power amplifier 106.

Inverters 304, 306–310 are preferably found in a CMOS hex inverter integrated circuit. Each CMOS inverter preferably comprises a P channel field effect transistor (PFET) and an N channel field effect transistor (NFET). Each PFET and NFET has a gate, a source and a drain. In an inverter configuration the PFET and NFET have their gates coupled together as the input of the inverter; their drains coupled together as the output of the inverter; the PFET source being coupled to VCC, the high level power supply, or the RF adjustable power source 399; the NFET source being coupled to VSS, the low level power supply, or ground; and any well or substrate appropriately strapped to the proper power supply. When using the CMOS hex inverter integrated circuit, maximum current per pin is approximately 75 milliamps. With the 30 inverters in parallel from the buffers 200A–200F or 200G–200L driving the antenna load, a maximum total RF peak current of approximately 2.25 amps is possible to drive the antenna. In the preferred embodiment only 1.5 amps of RF current is needed to drive the antenna 108. Since it is desirable to keep the drive impedance low, the plurality of inverters from the buffers are coupled in parallel whereby the output drive impedance is reduced.

Figure 4:
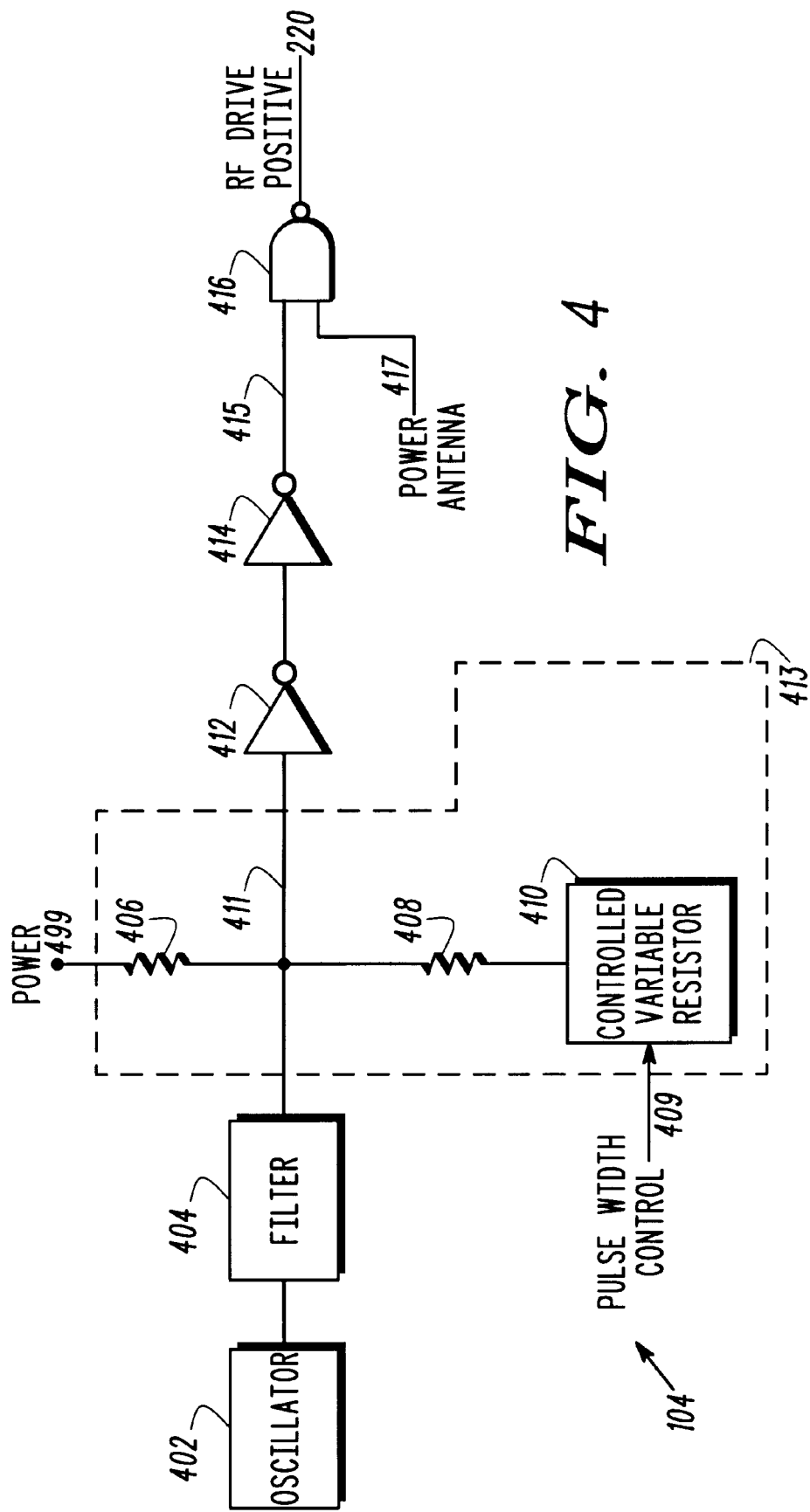
FIG. 4 is a block diagram of a modulator circuit for use with a power amplifier in accordance with the present invention.

FIG. 4 illustrates the modulator 104. Modulator 104 includes an oscillator 402, a filter 404, a voltage divider 413, inverters 412, 414 and NAND gate 416. Oscillator 402 is preferably a crystal oscillator generating an oscillating waveform at the fundamental frequency rate of 13.56 megahertz. Because maximum power is provided to the antenna 108 at the fundamental frequency, the filter 404 is coupled to the oscillator to reduce the second, third and other harmonics of the fundamental frequency. Preferably filter 404 is a passive bandpass filter made of resistors, inductors and capacitors for filtering out harmonics of the fundamental frequency.

In order to transmit data from the radio frequency exciter 101 to the transceiver 102, AM modulation is preferably used. However, other forms of modulation may be alternatively used including phase and frequency modulation or a combination of these. In the preferred RF system 100 the data rate of transmitted information is on the order of 50 kHz or 100 KBPS and the minimum required amount of modulation is 10% plus or minus 2%. Because power amplifier 106 is a push-pull type power amp, modulation of the amplitude of the carrier signal is accomplished by simply varying the duty cycle of the fundamental frequency. Varying the duty cycle changes the phase characteristics of the waveforms generated by power amplifier 106. Consequently, the amplitude of the fundamental of the radiated waveform of antenna 108 is altered.

Voltage divider 413 includes resistor 406, resistor 408 and controlled variable resistor 410. Resistor 406, in conjunction with resistor 408 and controlled variable resistor 410, divides the power supply voltage 499 at node 411. Resistors 406 and 408 are preferably around 20 Kohms. Pulse width control signal 409 sets the controlled variable resistor 410 such that the duty cycle of the waveform at node 411 varies. The controlled variable resistor 410 is preferably a digital potentiometer that can be set by a digital control word.

The variable duty cycle oscillating waveform on node 411 is a saw tooth rather than a sinusoidal waveform, and is squared up into a variable duty cycle square wave 415 by the inverters 412 and 414. Inverters 412 and 414 are preferably CMOS inverters so that their switching points are around one-half the power supply voltage. The transfer characteristics of the CMOS inverter are somewhat similar to a comparator such that inverter 412 can convert the sinusoidal waveform on node 411 into a square wave because the output of inverter 412 nearly swings over the range from the high power supply rail to the low power supply rail. However, it is alternatively preferable for inverter 412 to be a comparator with a reference voltage input for comparison with node 411.

The variable duty cycle square wave 415 is input into NAND gate 416. Power antenna signal 417 controls whether or not the variable duty cycle square waves are provided to the power amplifier 106 via RF drive positive signal 220. When power antenna signal 417 is high, the variable duty cycle square waves 415 are inverted and pass through the NAND gate 416 generating a variable duty cycle oscillating waveform on RF drive positive signal 220. When power antenna signal 417 is low, the output of NAND gate 416 stays high without oscillations thereby attenuating the power output by the antenna 108. This is desirable to reduce power consumption in the radio frequency exciter or to support an older AM modulation standard within a given RF system.

Amplitude modulation is also accomplished in other ways. For example, by using a more complicated control system, the power supply voltage supplied to the power amplifier 106 is varied to modulate the amplitude. Alternatively, the number of buffers 200A–200L driving the antenna 108 is varied. By varying the power supply voltage or the number of buffers 200A–200L, the amplitude of the oscillating waveform of the carrier signal is varied or modulated so as to transmit a signal. As previously discussed, the number of buffers 200A–200L is preferably varied by tristating the buffers themselves or the components of the buffers.

Figure 5:
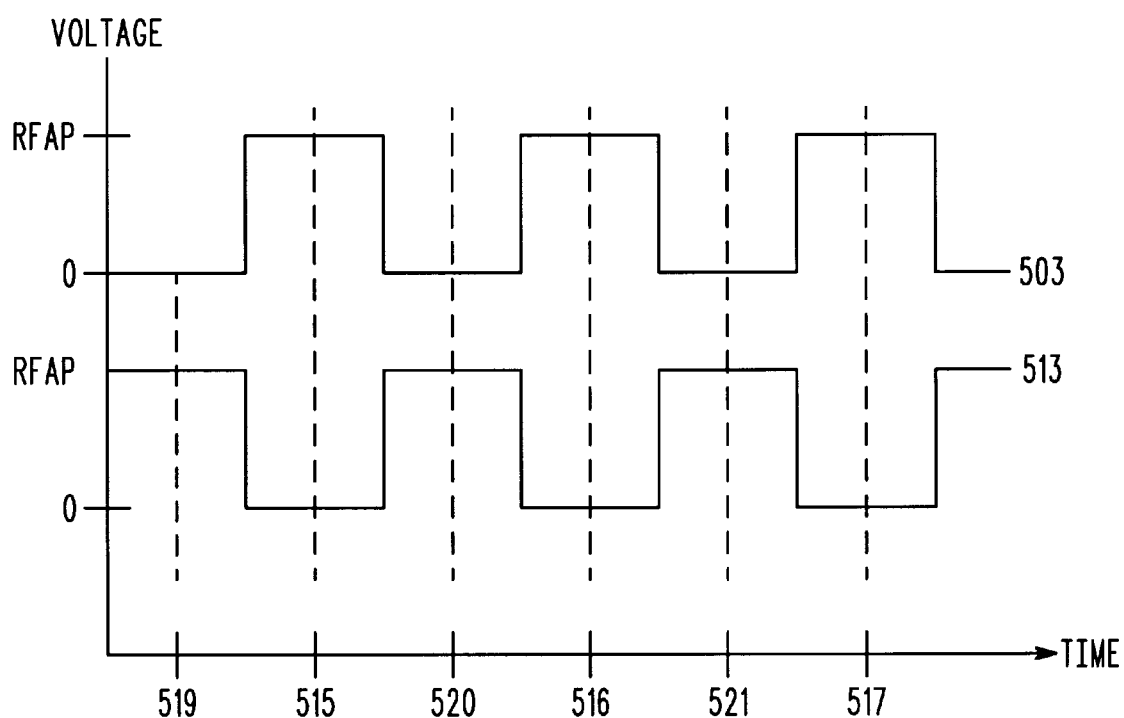
FIG. 5 is a waveform diagram illustrating exemplary ideal push-pull waveforms that are generated by the power amplifier circuitry of FIG. 2.

Power amplifier 106 is configured as a push-pull type circuit. The output of buffers 200A–200F is nearly one hundred eighty degrees out of phase with the outputs of buffers 200G–200L in order to maximize the drive current and power transfer into and out of the antenna 108. For example, refer to FIG. 5 where waveform 503 corresponds to output 203 of buffers 200A–200F and waveform 513 corresponds to output 213 of buffers 200G–200L. Waveform 513 is out of phase with waveform 503 by one hundred eighty degrees. Waveforms 503 and 513 both vary from zero volts to the radio frequency adjustable power (RFAP) source 399. If RFAP source 399 is set to five volts, the voltage across the antenna 108 at times 515, 516, 517 on the timeline of FIG. 5 is +5 volts referred to one side of the antenna. At times 519, 520, 521 on the timeline, the voltage across the antenna 108 is −5 volts referred to the same side of the antenna. In this manner the push-pull configuration of power amplifier 106 provides into the antenna 108 nearly twice the voltage and twice the current (or nearly four times the power) of that which can be generated by the buffers 200A–200L. Due to the delay generated by inverter 202, the buffers 200A–200F are never exactly 180 degrees out of phase with buffers 200G–200L so the power multiplication is slightly less.

Figure 6:
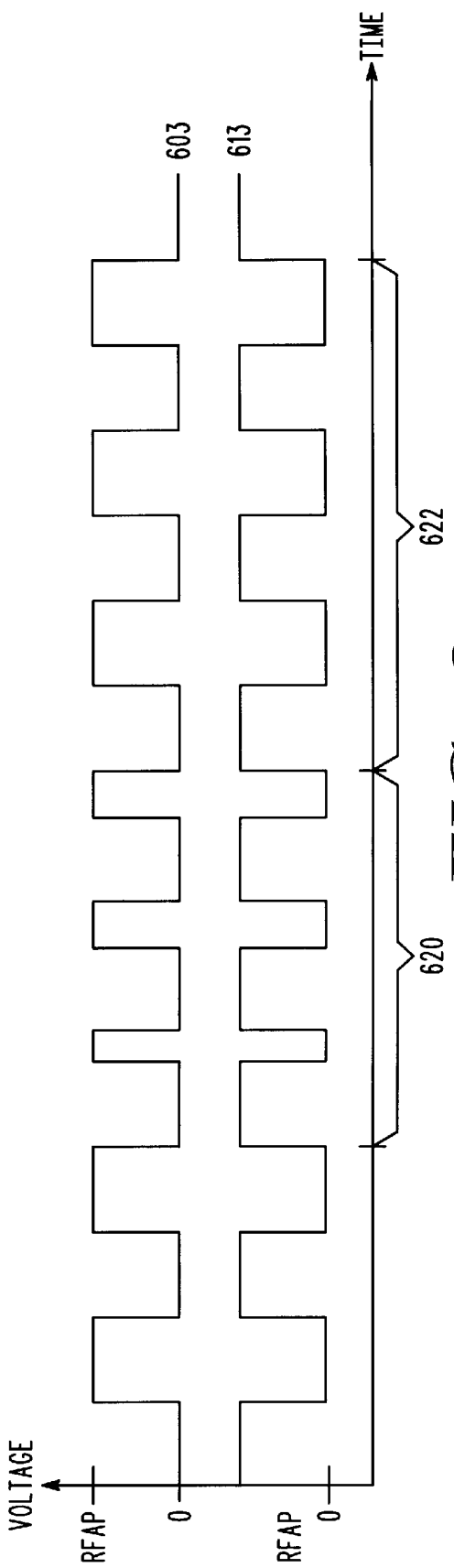
FIG. 6 is a waveform diagram illustrating an exemplary variation in duty cycle in the push-pull waveforms generated by the power amplifier circuitry of FIG. 2 in response to a variable duty cycle waveform generated by the modulator circuitry of FIG. 4.
Figure 7:
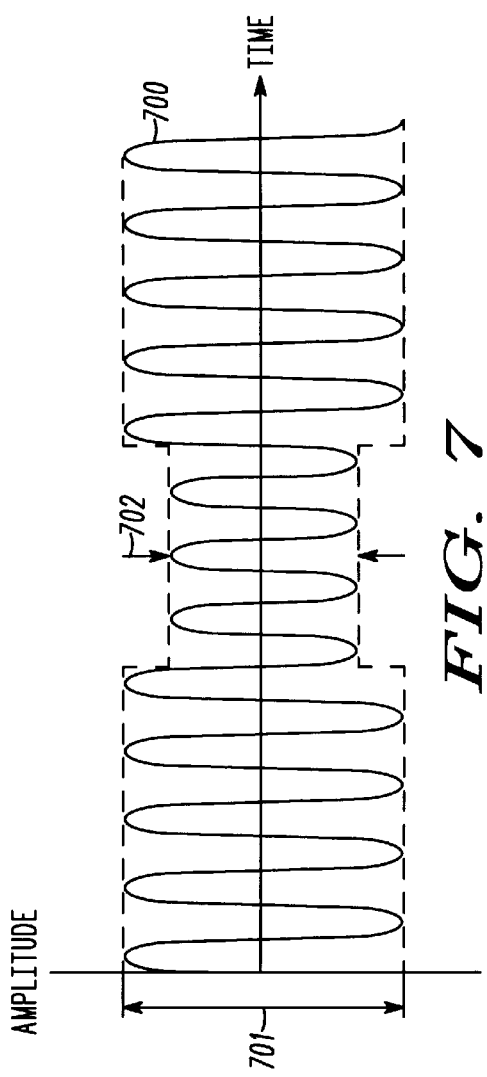
FIG. 7 is a waveform diagram illustrating an exemplary variation in amplitude of a radio waveform generated by an antenna coupled to a preferred embodiment of the present invention in response to a variation in duty cycle waveform generated by the modulator circuitry of FIG. 4.

In order to transmit an AM signal over antenna 108, modulator 104 varies the duty cycle of the oscillations of the carrier signal sent to power amplifier 106. The pulse width control signal 409 changes the resistance value of the controlled variable resistor 410 in order to vary the duty cycle of the fundamental frequency. Referring to the exemplary waveforms of FIG. 6 and FIG. 7, one can see how the amplitude changes as a result of varying the duty cycle of the waveform that is input into power amplifier 106. Waveforms 603 and 613 correspond to the outputs 203 and 213, respectively, of the power amplifier 106. During the time period 620 on the timeline of FIG. 6, the duty cycle is reduced from fifty percent such that there is a shorter period of time where waveform 603 is at its peak and waveform 613 is at its trough. In this manner, the output amplitude of the waveform of the carrier signal can be reduced for a given period of time. FIG. 7 illustrates an example of the waveform 700 that is transmitted by the antenna 108. The amplitude 701 is the one hundred percent amplitude that is output by power amplifier 106. Amplitude 702 is the reduced amplitude representing a part of some information that is transmitted by the antenna. According to an International Standards Organization (ISO) specification for RF systems, the minimum required amount of amplitude modulation is 10% plus or minus 2% in accordance with the equation %AM=100(a−b)/(a+b) where the Amplitude 701 is "a" and Amplitude 702 is "b". Thus for a minimum of 10% modulation, the amplitude 702 is 81.81% of amplitude 701. In order to be backward compatible with an older RF system, the alternate modulation percentage must be nearly 100% which can be provided through the power antenna signal 417 and NAND gate 416. In order to generate the amplitude 702, the duty cycle of the variable duty cycle square wave 415 is changed by modulator 104 such that the amplitude is reduced from the amplitude 701.

Referring to FIG. 2, after the modulator generates a carrier signal with a variable duty cycle, the power amplifier 106 amplifies the carrier signal with the variable duty cycle to drive the antenna 108. Buffers 200A–200F directly amplify, generating an amplified variable duty cycle oscillating waveform and driving the carrier signal onto one end of the antenna 108. Inverter 202 inverts the carrier signal, generating an inverted carrier signal, which is input into buffers 200G–200L. Buffers 200G–200L amplify the inverted carrier signal and drive it onto an opposite end of the antenna 108.

The present invention has many advantages over the prior art. The present invention requires no heat sinks because it efficiently transfers energy into the antenna. The present invention uses a minimum number of low power devices such that it may be applied to portable battery operated systems. Furthermore, the power transferred to the antenna by the present invention is adjustable simply by varying the voltage of the power supplied to the power amplifier or varying the number of buffers used.

The push-pull configuration of the power amplifier nearly quadruples the power generated by the power amplifier. Yet, the present invention allows one to use simple methods to transmit information by amplitude modulation. The power amplifier circuitry requires no tuning to generate the carrier signal at the carrier frequency. Additionally, the present invention is preferably manufactured using standard low cost components utilizing a minimal amount of PCB area in order to readily mass manufacture a radio frequency exciter.

While the present invention has been described in particular embodiments, the present invention should not be construed as limited by such embodiments, but rather construed according to the claims below.

What is claimed is:

1. A radio frequency power amplifier and transmitter for driving an antenna to radiate radio frequency energy, the radio frequency power amplifier and transmitter comprising:

a first plurality of buffers coupled together in parallel, the first plurality of buffers receiving a waveform signal as input and providing a driving signal to the antenna;

a first inverter receiving the waveform signal as an input, the first inverter generating an out-of-phase waveform signal;

a second plurality of buffers coupled together in parallel, the second plurality of buffers receiving the out-of-phase waveform signal from the first inverter as input and providing an out-of-phase driving signal to the antenna; and wherein the first plurality of buffers and the second plurality of buffers are pushing or pulling responsive to the waveform signal and the out-of-phase waveform signal such that radio frequency energy is radiated by the antenna.

2. The radio frequency power amplifier and transmitter of claim 1, wherein each buffer of the first plurality of buffers and the second plurality of buffers is selectively activated to vary power delivered to the antenna.

3. The radio frequency power amplifier and transmitter of claim 1, wherein the first plurality of buffers and the second plurality of buffers have power supply connections coupled to an adjustable power supply such that a power generated by the radio frequency power amplifier and transmitter is adjustable.

4. The radio frequency power amplifier and transmitter of claim 1, wherein the waveform signal and the out-of-phase waveform signal each have a variable duty cycle and the first plurality of buffers and the second plurality of buffers varies an amplitude of a signal transmitted by the antenna, the amplitude being responsive to the variable duty cycle.

5. The radio frequency power amplifier and transmitter of claim 1, wherein each buffer of the first plurality of buffers and the second plurality of buffers has an input signal and an output signal and each buffer comprises:

a buffer inverter, the buffer inverter inverting the input signal to generate an inverted signal; and a plurality of additional inverters, the plurality of additional inverters coupled in parallel together and coupled in series to the buffer inverter such that the plurality of additional inverters inverts the inverted signal received from the buffer inverter and produces the output signal.

6. The radio frequency power amplifier and transmitter of claim 5, wherein the buffer inverter and the plurality of additional inverters are CMOS inverters.

7. The radio frequency power amplifier and transmitter of claim 6, wherein each of the CMOS inverters comprises:

a P channel field effect transistor having a gate coupled to an input of the CMOS inverter, a source coupled to an adjustable power supply, and a drain coupled to an output of the CMOS inverter; and an N channel field effect transistor having a gate coupled to the input of the CMOS inverter, a source coupled to a low level power supply, and a drain coupled to the output of the CMOS inverter.

8. The radio frequency power amplifier and transmitter of claim 5, wherein the buffer inverter and the plurality of additional inverters have power supply connections coupled to an adjustable power supply such that a power output generated by the radio frequency power amplifier and transmitter is adjustable.

9. The radio frequency power amplifier and transmitter of claim 5, wherein each buffer of the first plurality of buffers and the second plurality of buffers further comprises:

an input protection resistor coupled to an input of the buffer inverter, the input protection resistor receiving the input signal and protecting the input of the buffer inverter from excessive voltage and current;

an output protection resistor coupled to an output of the plurality of additional inverters, the output protection resistor transferring the output signal of each buffer and protecting the output of the plurality of additional inverters from excessive voltage and current; and a power supply bypass capacitor coupled to a high level power supply of the buffer inverter and the plurality of additional inverters at a first end and a low level power supply at a second end.

10. A radio frequency exciter for exciting and transmitting information to a wireless transceiver, the radio frequency exciter comprising:

an antenna having a first connection at one end and a second connection at an opposite end;

a modulator that generates a carrier signal and varies a duty cycle of the carrier signal in response to the information;

a power amplifier coupled to the modulator and the first and second connection of the antenna, the power amplifier receiving and amplifying the carrier signal responsive to the duty cycle, the power amplifier comprising:

a first plurality of buffers coupled together in parallel, the first plurality of buffers receiving the carrier signal responsive to duty cycle as input and providing a driving signal to the first connection to the antenna;

a first inverter that receives the carrier signal as an input, the first inverter generating an out-of-phase waveform signal;

a second plurality of buffers coupled together in parallel, the second plurality of buffers receiving as input the out-of-phase waveform signal from the first inverter and providing an out-of-phase driving signal to the second connection to the antenna; and wherein the first plurality of buffers and the second plurality of buffers are pushing or pulling responsive to the carrier signal and the out-of-phase waveform signal such that radio frequency energy is radiated by the antenna.

11. The radio frequency exciter of claim 10 wherein each buffer of the first plurality of buffers and the second plurality of buffers has an input signal and an output signal and each buffer comprises:

a buffer inverter, the buffer inverter inverting the input signal to generate an inverted signal; and a plurality of additional inverters, the plurality of additional inverters coupled in parallel together and coupled in series to the buffer inverter such that the plurality of additional inverters inverts the inverted signal received from the buffer inverter and produces the output signal.

12. The radio frequency exciter of claim 11, wherein the first inverter, the buffer inverter, and plurality of additional inverters are CMOS inverters.

13. The radio frequency exciter of claim 12, wherein the first inverter, the buffer inverter, and the plurality of additional inverters are CMOS inverters having power supply connections coupled to an adjustable power supply such that a power output generated by the power amplifier is adjustable.

14. A method for amplifying and modulating an oscillating waveform of a carrier signal in order to transmit information to a wireless transceiver, the method comprising the steps of:

(a) generating the oscillating waveform with a duty cycle of approximately fifty percent;

(b) filtering out undesirable harmonics from the oscillating waveform;

(c) varying the duty cycle of the oscillating waveform responsive to information to generate a variable duty cycle oscillating waveform;

(d) amplifying the variable duty cycle oscillating waveform with a CMOS power amplifier to generate an amplified variable duty cycle oscillating waveform; and (e) driving an antenna with the amplified variable duty cycle oscillating waveform to transmit information to the wireless transceiver.

15. The method of claim 14 for amplifying and modulating a carrier signal in order to transmit information to a passive transceiver, further comprising the step of:

(f) adjusting a voltage of a power supply of the CMOS power amplifier to adjust amplification of the variable duty cycle oscillating waveform.

16. The method of claim 14, wherein the CMOS power amplifier comprises:

a first plurality of CMOS buffers coupled together in parallel, the first plurality of CMOS buffers receiving the variable duty cycle oscillating waveform as input and providing a driving signal to the antenna;

an inverter that inverts the variable duty cycle oscillating waveform to generate an out-of-phase variable duty cycle oscillating waveform; and a second plurality of buffers coupled together in parallel, the second plurality of buffers receiving the out-of-phase variable duty cycle oscillating waveform as input and providing an out-of-phase driving signal to the antenna.

* * * * *